(12) United States Patent
Pedersen et al.

(10) Patent No.: US 10,317,437 B2
(45) Date of Patent: Jun. 11, 2019

(54) LANGMUIR PROBE

(71) Applicant: Universitetet I OSLO, Oslo (NO)

(72) Inventors: Arne Pedersen, Vøyenenga (NO); Tore André Bekkeng, Snarøya (NO); Espen Trondsen, Oslo (NO); Jøran Moen, Lier (NO)

(73) Assignee: Ukniversitetet I Olso, Oslo (NO)

( * ) Notice: Subject to any disclaimer, the term of this patent is extended or adjusted under 35 U.S.C. 154(b) by 641 days.

(21) Appl. No.: 14/760,756

(22) PCT Filed: Jan. 16, 2014

(86) PCT No.: PCT/EP2014/050824
§ 371 (c)(1),
(2) Date: Jul. 14, 2015

(87) PCT Pub. No.: WO2014/111476
PCT Pub. Date: Jul. 24, 2014

(65) Prior Publication Data
US 2015/0355243 A1 Dec. 10, 2015

(30) Foreign Application Priority Data

Jan. 16, 2013 (GB) .................................. 1300799.2

(51) Int. Cl.
| | |
|---|---|
| *G01R 19/00* | (2006.01) |
| *G01R 19/25* | (2006.01) |
| *H05H 1/00* | (2006.01) |
| *B64G 1/66* | (2006.01) |

(52) U.S. Cl.
CPC ............... *G01R 19/25* (2013.01); *B64G 1/66* (2013.01); *H05H 1/0075* (2013.01)

(58) Field of Classification Search
CPC ......... G01R 19/25; B64G 1/66; H05H 1/0075
USPC .......................................................... 702/64
See application file for complete search history.

(56) References Cited

U.S. PATENT DOCUMENTS

| | | |
|---|---|---|
| 5,031,125 A | 7/1991 | Shimizu et al. |
| 5,448,173 A | 9/1995 | Shinoharra et al. |
| 2009/0203228 A1* | 8/2009 | Kohno .................. C23C 16/345 438/792 |

OTHER PUBLICATIONS

Luke Goembel: "Plasma Analyger for Measuring Spacecraft Floating Potential in Leo & Geo", IEEE Transactions on Plasma Science, IEEE Service Center, Piscataway, NJ, US; vol. 40, No. 2, dated: Feb. 1, 2012, pp. 155-166.

(Continued)

*Primary Examiner* — Huan Hoang
(74) *Attorney, Agent, or Firm* — Eversheds Sutherland (US) LLP

(57) ABSTRACT

A method of determining payload potential may include the steps of receiving data on a first bias voltage and a resulting first collected current of a first needle of a multi-needle Langmuir probe, receiving data on a second bias voltage and a resulting second collected current of a second needle of the multi-needle Langmuir probe, assigning a value for the electron temperature in which the multi-needle Langmuir probe was operating, and using the current and voltage data, the assigned electron temperature value and Langmuir probe theory to calculate the platform potential of the multi-needle Langmuir probe.

14 Claims, 2 Drawing Sheets

(56) References Cited

OTHER PUBLICATIONS

Jacobsen, et al.: "A New Langmuir Probe Concept for Rapid Sampling of Space Plasma Electron Density." Measurement Science & Technology, IOP, Bristol, GB, vol. 21, No. 8, dated Aug. 1, 2010, p. 85902.
Bekkeng, et al.: "Design of a Multi-Needle Langmuir Probe System", Measurement Science & Technology, Bristol GB, vol. 21, No. 8, Aug. 1, 2010, p. 85903.
Bekkeng, et al.: "Sensor Selection Working Group—Final Report." University of London, UK, dated Mar. 19, 2012, pp. 37-39.

\* cited by examiner

LANGMUIR PROBE

TECHNICAL FIELD

The invention relates to a method of calculating a space craft platform potential. The invention also relates to a device for carrying out the method and a related computer program product. Such a device can be implemented on all types of spacecraft operating in the ionosphere.

BACKGROUND OF THE INVENTION

Langmuir probes have been widely used to analyze both laboratory and space plasmas. The basic principle of the Langmuir probe is to expose a conductor to the plasma, bias it relative to some reference potential (the platform potential) and measure the collected current. A representative response of a Langmuir probe is shown in FIG. 1.

A body in a plasma (having a plasma potential $V_p$) will experience a current as it is hit by the electrons and ions of the plasma. This changes its charge, which in turn affects the electron and ion currents. In a short time the body will acquire a charge so that the net current is zero. The equilibrium potential attained by a conductive body immersed in a plasma, such that the total current due to electrons and ions to the conducting surface sums to zero is known as the platform potential ($V_f$). The platform potential is also referred to as the spacecraft potential, payload potential, floating potential or payload floating potential. The plasma potential $V_p$, is the potential at which no fields/sheath exist between the probe surface and the surrounding plasma. A probe potential lower than $V_p$ repels electrons, and a potential higher than $V_p$ repels ions.

When the probe is negatively biased it will attract positive ions and repel electrons. At a sufficiently negative bias the positive ion current will dominate, this is called the 'ion saturation region' 1. When the probe is positively biased it will repel positive ions and attract electrons. At sufficiently positive bias the electron current will dominate and this is known as the 'electron saturation region' 2. At an intermediate bias, the current will be the sum of the ion and electron currents, this is known as the 'retardation region' 3.

The Langmuir probe is normally used in a voltage-sweep mode. Performing several measurements at different biases a current-voltage graph can be produced. This is then fitted to the theoretical equations for plasma, photoelectron and possibly other currents to extract plasma parameters.

For a better understanding on how turbulence in ionospheric plasma affects high frequency (HF) radio communication and Global Navigation Satellite Systems (GNSS) signals, a study of the driving processes which cause turbulence and structuring of the ionospheric plasma has to be carried out. One of the key parameters to understand turbulence in space plasma is the electron density which can be measured using a Langmuir probe.

Performing a Langmuir probe sweep takes time (on the order of 1 s). There are also several factors that can cause measurements to deviate from the ideal equations. It has been found that the swept Langmuir probe provides low accuracy ionospheric electron density measurements due to uncertainties in the determination of the spacecraft potential as well as the electron temperature. Also, a sample time of 1 s means that the resolution of the measurements is limited.

Thus, to overcome this problem it is known to use a spherical fixed bias Langmuir probe. However, the current collected by a spherical fixed bias probe depends not only on the electron density but also on the electron temperature and the spacecraft potential. As a result, the absolute electron density is very difficult to determine. There are further physical effects that complicate efforts to obtain absolute electron density measurements.

To overcome this problem it is known to provide a Langmuir probe system comprising two or more fixed-bias cylindrical probes which is known as a multi-Needle Langmuir probe (m-NLP). Each cylindrical probe is biased to a different potential in the electron saturation region and the probes are sampled simultaneously to obtain a measurement of the collected current of each probe. This device can be used to determine the absolute electron density without having to know the electron temperature and spacecraft potential (also referred to as the platform potential, payload potential or payload floating potential).

The m-NLP is able to measure electron density with a very high time resolution, which provides high spatial resolution of electron density measurements.

To perform the absolute electron density measurements using the m-NLP only an estimate of the spacecraft potential is necessary. Potentials well above the spacecraft potential can be used to ensure that the probes are operating in the saturation region where absolute electron density measurements can be taken.

The square of the probe current ($I_c^2$) versus the probe potential (V) yields a straight line. The line gradient is proportional to the electron density squared. The absolute electron density can be calculated according to the following expression:

$$n_e = \sqrt{K \frac{\Delta(I_c^2)}{\Delta V}} \quad (1)$$

where K is a constant equal to $m_e/2q(q2rl)^2$ and $m_e$ is the electron mass, q is the electron charge, r is the radius of the cylinder, l is the length of the cylinder, $\Delta(I_c)^2$ is the difference in collected probe currents and $\Delta V$ is the difference in probe bias between the two biased probes.

SUMMARY OF THE INVENTION

According to a first aspect, the present invention provides a method of determining platform potential, the method comprising: receiving data on a first bias voltage and a resulting first collected current of a first needle of a multi-needle Langmuir probe; receiving data on a second bias voltage and a resulting second collected current of a second needle of the multi-needle Langmuir probe; assigning a value for the electron temperature in which the multi-needle Langmuir probe was operating; and using the current and voltage data, the assigned electron temperature value and Langmuir probe theory to calculate the platform potential of the multi-needle Langmuir probe.

The inventors of the present invention have realised that, surprisingly, the multi-Needle Langmuir probe (m-NLP) that has previously been used for obtaining absolute electron density measurements could be used to obtain a measurement of the platform potential. Langmuir probe theory provides a relationship between bias voltage, the collected current, the platform potential and the electron temperature. The bias voltage and collected current may readily be measured, but it is hard to determine the electron temperature. Unexpectedly, it has been found that a value (for example an estimated value) could be assigned for the electron temperature in which the received data was collected, i.e. that the calculation of platform potential is not dependent on knowing the exact value of electron temperature.

Langmuir probe measurements depend on the potential of the chassis/platform relative to which the bias is being applied, i.e. electrical ground. Instrument ground is connected to the payload structure so electrical ground is the same as the payload floating potential. As mentioned above, payload floating potential is the equilibrium potential attained by a conductive body immersed in a plasma, such that the total current due to electrons and ions to the conducting surface sums to zero. In other words the platform potential is the equilibrium potential of the m-NLP when in a plasma. The platform potential is the potential of the multi-needle Langmuir probe when it is in appropriate electrical contact with the platform. Changes in the payload floating potential, i.e. spacecraft charging can affect the measurements taken by Langmuir probes. Knowledge of payload charging, and the various processes which contribute to payload charging, is therefore crucial for proper analysis of typical Langmuir probes. Knowledge of the spacecraft potential is also useful for the operation of a number of other devices on a spacecraft. Thus the use of the m-NLP to obtain a measurement of the platform potential can be used to ensure other devices are operating in the correct conditions or can be used to adjust or correct data.

In response to a charged body, a plasma will form a sheath around the body with a net charge of opposite sign to that of the body. This shields the plasma outside the sheath from the electric field of the body. The scale length of this sheath is known as the Debye length.

The Debye shielding length $\lambda_D$ is given by $$\lambda_D = \sqrt{\frac{\epsilon_0 k_B T_e}{n_e q_e^2}} \quad (2)$$

where $n_e$ is the electron density, $q_e$ is the electron charge, $k_B$ is Boltzmann's constant, $T_e$ is the electron temperature and $\epsilon_0$ is the permittivity of free space.

The size of a Langmuir probe relative to the Debye length determines what effects the sheath has on the measured currents. The simplest case is the one where the probe scale size is much smaller than the Debye length. When this is true, sheath effects can be ignored.

From Langmuir probe theory, the current collected by a cylindrical probe with a length much larger than its radius, a radius which is much less than the Debye shielding length and at a positive potential in the electron saturation region (assuming the probe is located in a Maxwellian plasma) is:

$$I = n_e e A_p \sqrt{\frac{k_B T_e}{2\pi m_e}} \frac{2}{\sqrt{\pi}} \sqrt{1 + \frac{V_b - V_f}{V_e}} \quad (3)$$

where $n_e$ is the electron density, e is the charge of an electron, $k_b$ is Boltzmann's constant, $T_e$ is the electron temperature, $m_e$ is the mass of an electron, $A_p$ is the probe surface area, I is the length of the cylinder and $V_b$ is the potential applied to the probe, $V_f$ is the payload floating potential and $V_e$ is Boltzmann's constant times the electron temperature divided by the charge of an electron. This equation is valid under the assumption of a non-drifting, collisionless and non-magnetized plasma. It has been found that these assumptions are sufficiently fulfilled in almost the entire ionosphere with the exception of the lowest part of the D layer.

For a cylindrical probe operated in the electron saturation region (with all the above assumptions), there is a linear relationship between the square of the collected current $I^2$ and the applied bias voltage V that can be used to determine the electron density. Thus, if two measurements in the electron saturation region are taken the difference in the square of the current at those two points is given by $$I_2^2 - I_1^2 = (C N_e A_p)^2 (V_{b2} - V_{b1}) \quad (4)$$

where C is $$\frac{e^{3/2}}{\pi} \sqrt{\frac{2}{m_e}} \quad (5)$$

This can be rearranged to give $$n_e = \frac{1}{CA_p} \sqrt{\frac{I_2^2 - I_1^2}{V_{b2} - V_{b1}}} \quad (6)$$

The derivation of absolute electron density using a multi-Needle Langmuir probe does not depend on probe potential relative to plasma potential, but depends only on the potential difference between the two needles. This effectively makes the m-NLP instrument immune to payload charging effects as long as the charging is not so severe that the operation of the needles is brought into the electron retardation region.

Equation (3) can also be used to find $V_f$, the platform potential of the rocket payload, which is used as the reference for the probe bias voltage V.

$$R = \left(\frac{I_2}{I_1}\right)^2 = \frac{V_e + V_{b2} - V_f}{V_e + V_{b1} - V_f} \quad (7)$$

This gives the following equation for calculation of the floating potential of the platform $V_f$.

$$V_f = \frac{(RV_{b1}) - V_{b2}}{R - 1} + V_e \quad (8)$$

By equation (8) it can be seen that the platform potential can be derived by the two known bias voltages and the collected current by the biased probes. For the equations to be valid the probes have to be operated in the electron saturation region. The only unknown term in equation (8) is $V_e$, which depends on electron temperature $T_e$.

As mentioned above, the method comprises assigning a value for the electron temperature. In a preferred embodiment the assigned value is an estimate which is preferably based on a model. For example, the assigned value for electron temperature could be a model value or a best guess.

The inventors of the present invention have realised that, unexpectedly, using an assigned value for the electron temperature has limited effect on the accuracy of the platform potential calculations. This has been confirmed experimentally. For example, in the mesosphere region during winter conditions, $T_e$ is expected to range from 200K to 400K. Assuming $T_e$=200K, the term $V_e$ will be 17 mV, and for $T_e$=400K the term $V_e$=34 mV. The inventors have performed calculations using $T_e$=400K, to get a worst case uncertainty from the $T_e$ term and discovered that the error in $V_f$ calculation due to unknown $T_e$ will be on the order of few tens of mV.

When the data is received from a m-NLP with cylindrical probes the platform potential may be calculated from equation (7).

To obtain measurements of the electron density a Langmuir probe is biased relative to the platform potential. As long as the probes are operated in the electron saturation region, it is not necessary to know the payload potential to derive absolute electron density (which may also be referred to as the absolute plasma density). All that is needed is a known potential difference between the multiple needles. However, it is useful to be able to measure the platform potential to ensure that the Langmuir probe is operating in this region.

It has been found that in a quasi-neutral Maxwellian plasma, electron thermal current collected by a conductive body is an order of magnitude larger than the ion thermal current. Thus, in a typical mesosphere/ionosphere night time (darkness) plasma, any conductive body attains a negative floating potential such that the ion and electron collected currents sum to zero, and the floating potential varies from −0.1 V to −0.6 V depending on electron temperature. A sounding rocket payload can obtain a significantly different charge if there are exposed potentials on its surface which collect additional electrons (payload charges more negative) or emits photoelectrons (payload charges more positive). It has been found in practice that for certain payloads the average level of payload potential ranges from −2 to −2.5 V and that there is an altitude region where the payload potential changes by 50%. In other words the payload floating potential can change significantly.

Moreover, the payload charge can be difficult to predict with known models therefore a measurement of the payload potential is advantageous.

The method preferably comprises determining the payload floating potential in flight or in orbit, and/or in real time. For example, data analysis may be carried out by an onboard processor or computer which may provide an on-board monitor of the platform floating potential.

This means that the calculated payload floating potential can be used to ensure that the other devices are operating in the correct regime. For example, for a multi-needle Langmuir probe being used to measure absolute electron density, the measurement of the payload floating potential could be used to ensure that the m-NLP is operating in the electron saturation regime. As a result the data received from certain instruments may be corrected or disregarded depending on the determined platform potential.

When the payload potential is determined in orbit and/or in real time the method may include controlling the payload floating potential based on the determined payload potential. In a preferred embodiment, the method comprises adjusting the payload potential to be at a desired level. For example, the m-NLP apparatus may comprise an electron emitter for controlling the payload potential to be at a desired value. The electron emitter may eject an electron beam into the surrounding plasma to maintain the floating potential at a desired value or within a desired range. The method may comprise active spacecraft charging mitigation. It is preferable for the satellite's surface to be at least partially conductive so as to avoid differential charging. Thus the method may comprise sending a signal indicative of the determined platform potential to a controller.

In a preferred embodiment there is a feedback loop between the determined payload floating potential and the control of the payload floating potential. This means the payload floating potential can be maintained at a certain level.

It has been discovered that a multi-needle Langmuir probe can be used to measure absolute plasma density (i.e. electron density) and payload floating potential simultaneously.

The method may comprise, providing a multi-needle Langmuir probe which preferably has cylindrical probes; biasing a first needle of the multi-needle Langmuir probe at a first potential relative to the platform potential; biasing a second needle of the multi-needle Langmuir probe at a second potential relative to the platform potential and measuring the collected current from each of the biased needles.

In theory a m-NLP with two probes is sufficient to be able to measure the payload floating potential. Therefore in an embodiment the data is received from a multi-needle Langmuir probe which comprises two probes.

It is desirable to have more than two probes as this allows the performance of the device to be checked. Also, having more than two probes will also add some redundancy to the system, so that it can still function if one of the probes does not work as intended. Therefore the multi-needle Langmuir probe from which the data is obtained preferably comprises more than two probes and more preferably four probes.

This is desirable to be able to obtain a measure of the error in the measurement and to be able to detect systematic errors. Four probes provide the ability to check the obtained data and provide redundancy whilst keeping the amount of hardware necessary on the payload to a minimum.

When the multi-needle Langmuir probe from which the data is obtained comprises more than two probes the method may comprise checking the data. The method can thus be used to determine whether there are errors in the measurements and may include such a step.

Preferably the radius of each of the probes of the multi-needle Langmuir probe from which the data is received is less than the Debye length.

For example, if the Debye length is the same as, or less than, the radius of the probe the calculated values will be affected. With this in mind, it is also of benefit to have more than two probes so that the device has the capability to test whether it is measuring in the plasma regime in which our equations are valid, i.e. the method can comprise a checking step. Having such a quality check enables a greater confidence in the calculated values. Depending on the nature of the disturbance it might be possible to correct the data to compensate for it, thus the method may comprise correcting the data if an error is detected.

In a typical case, the Debye length will be in the range 2 mm-5 cm and most of the time on the order of 1 cm. This means that the radius of the probes of the m-NLP from which the data is obtained is preferably less than 1 mm.

In a second aspect the present invention provides a device for determining a platform potential, the device comprising a multi-needle Langmuir Probe and a processor, wherein the processor is arranged to receive data on a first bias voltage and a resulting first collected current of a first needle of a multi-needle Langmuir probe; receive data on a second bias voltage and a resulting second collected current of a second needle of the multi-needle Langmuir probe; assign a value for the electron temperature in which the multi-needle Langmuir probe is operating; and use the current and voltage data, the assigned electron temperature value and Langmuir probe theory to calculate the platform potential of the multi-needle Langmuir probe.

In a preferred embodiment the processor is arranged to carry out the method of the first aspect and optionally some or all of the preferable features of that method as discussed above.

Preferably the m-NLP has cylindrical probes. As discussed above, this means that certain calculations (based on Langmuir's equation for cylindrical probes) can be used to determine the platform potential.

Preferably the m-NLP has more than two probes and more preferably four probes. This is for the reasons discussed above in relation to the first aspect.

Preferably the radius of each probe is less and more preferably significantly less than the Debye length. This is for the reasons discussed above in relation to the first aspect.

In a preferred embodiment the device comprises a controller. This means that the platform potential can be controlled on the basis of the calculated platform potential. The device may also comprise an electron emitter for controlling the platform potential. This means that the platform potential can be controlled as required. The controller may be separate to the processor or it may be a part of the processor.

The multi-needle Langmuir probe may be used in a CubeSat which is a discrete scalable cuboid spacecraft, measuring 100×100×100 mm and weighing a maximum of 1.33 kg. This is referred to as a 1 U CubeSat. By stacking two or three of these 1 U spacecraft on top of each other, one can obtain a 2 U or 3 U spacecraft.

When the device is deployed on a CubeSat it is preferable for the device to comprise (and more preferably consist of) one electronic printed circuit board (PCB), one electron emitter, four miniaturized spherical Langmuir probes on separate booms, and four individual boom deployment systems.

It is preferable to for the device to be arranged to perform on-board processing so that it is possible to transfer electron density data with reduced telemetry downlink requirements. This on-board processing may also mean that real-time control, such as control of the spacecraft potential, can be carried out.

The method may carry out real-time calculation of electron density and spacecraft potential in a field-programmable gate array (FPGA). The implementation may be achieved by using Mathworks HDL Coder, which generates target-independent, synthesizable VHDL or Verilog code. Alternatively (for example when processing is not carried out on-board) the electron density and spacecraft potential may be calculated post-flight using Matlab scripts.

Preferably the throughput of the implemented algorithm in hardware is as fast as or faster than the highest sampling rate of the system, which may for example be set to 10 kHz.

The four measured currents and probe bias values may be stored in two separate arrays. If a FPGA is used, a significant decrease in the required computation time may be achieved by running parts of the algorithm in parallel. The information calculated on the spacecraft floating potential may subsequently be sent to the digital arithmetics controlling the electron emitter so that the spacecraft potential can be controlled in real-time.

The device may comprise a spring-loaded boom system, which may comprise separate boom deployment mechanisms for each boom.

The device may be put on one of the 10×10 cm edges of the spacecraft, which when placed in front and normal to the ram direction will ensure that the probes are situated in an undisturbed plasma. The boom system may be used on a 2 U CubeSat or scaled to a 3 U CubeSat by increasing the length of the boom elements.

Deployment of the boom system may be handled by separate deployment mechanisms, which are designed to be a part of PCB side panels of the spacecraft, which may also hold the solar panels. The deployment mechanism may be a burn-wire type, where the wire is cut by running a certain current and voltage through the wire for a given amount of time. For example, this may be achieved by running approximately 0.5 A of current at 3.3 V supply voltage for approximately 3 seconds. The wire cutting mechanism may be made of a resistor (e.g. 0603 or 0805 size resistor) placed directly onto the PCB, on each side of the probe element. The burn-wire may be folded on top of the resistor. Preferably the wire cutting mechanism comprises two resistors to ensure redundancy in the case that one of the resistors encounters a mechanical or electrical failure. When the current is applied, the resistor element gets heated to high temperature by the current flow, and thereby melts the burn-wire.

In a third aspect the present invention provides a computer program product comprising instructions which when executed by a processor cause the processor to be arranged to receive data on a first bias voltage and a resulting first collected current of a first needle of a multi-needle Langmuir probe; receive data on a second bias voltage and a resulting second collected current of a second needle of the multi-needle Langmuir probe; assign a value for the electron temperature in which the multi-needle Langmuir probe is operating; and use the current and voltage data, the assigned electron temperature value and Langmuir probe theory to calculate the platform potential of the multi-needle Langmuir probe.

In a preferred embodiment the computer program product when executed can cause the processor to be able to carry out the some or all of the preferable features of the first aspect as discussed above.

Any of the above optional or preferred features of the invention are applicable to all of the aspects of the invention.

BRIEF DESCRIPTION OF THE DRAWINGS

Certain preferred embodiments of the present invention will now be described by way of example only with reference to the accompanying drawings, in which.

DETAILED DESCRIPTION

Figure 1:
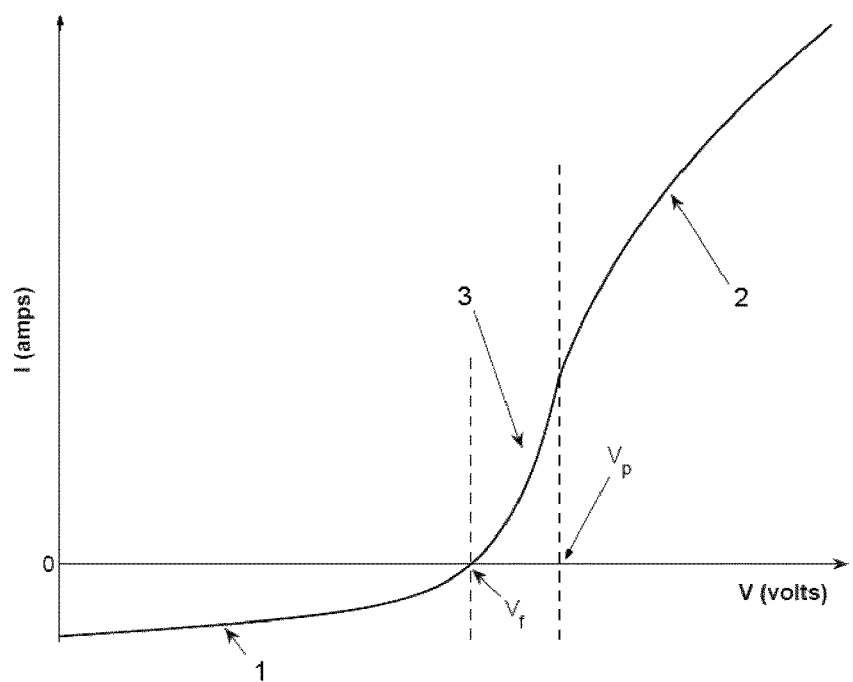
FIG. 1 shows a representative response of a Langmuir probe.
Figure 2:
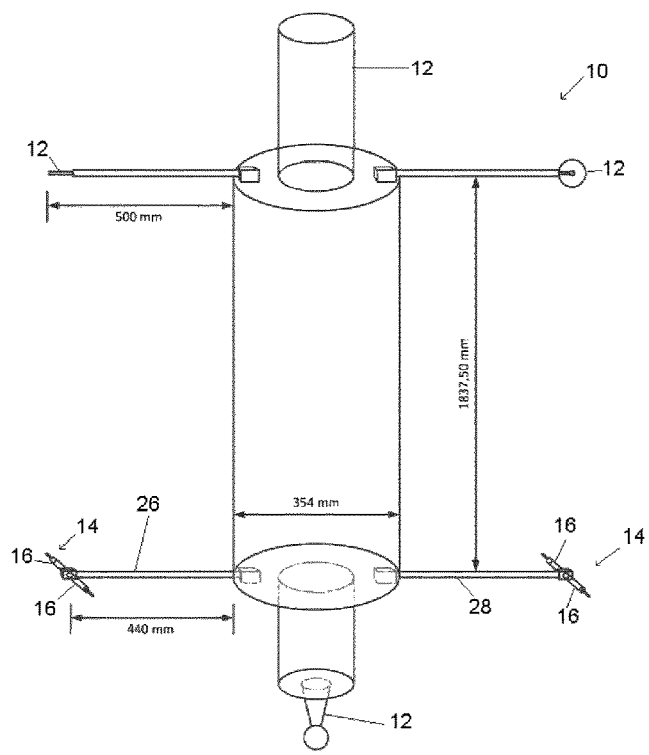
FIG. 2 shows an exemplary payload configuration with a m-NLP.

Typical sounding rockets have a two-stage motor configuration consisting of a first stage motor, and a second stage motor. A payload after motor separation is shown in FIG. 2.

Figure 3:
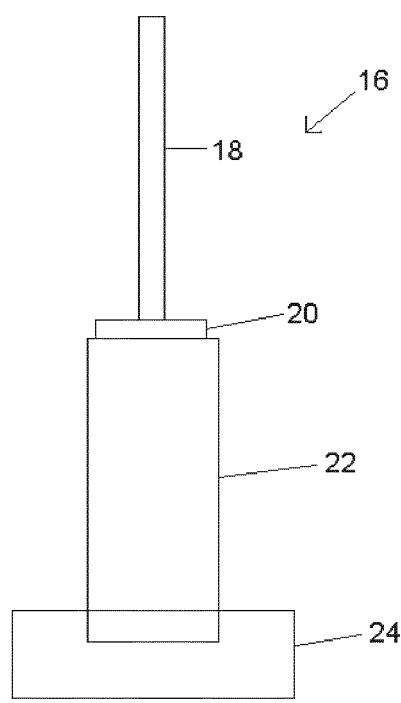
FIG. 3 shows an exemplary probe.

The exemplary payload 10 comprises a number of devices 12, measuring i.e. plasma parameters. The payload also comprises a multi-Needle Langmuir Probe (m-NLP) 14 towards the aft of the payload 10. The m-NLP instrument 14 consists of four miniaturized cylindrical Langmuir probes 16. Each probe has the configuration shown in FIG. 3.

The probes comprise a centre conductor 18, a dielectric insulator 20 and an outer braid 22. The dimensions mentioned below refer to a specific probe developed for use in the near Earth ionosphere. The exposed part of the centre conductor 18 has a length of 25 mm. Covering the unexposed part of the centre conductor is a dielectric insulator 20 which has an exposed length of about 1 mm. The unexposed part of the dielectric insulator 20 is surrounded by a braid 22 which has an exposed length of 15 mm. This is held within an insulation portion 24. The short insulation area 20 between the braid 22 and the centre conductor 18 is provided to avoid a short-circuit between the braid 22 and the centre conductor 18.

The central conductor 18 has a diameter of 0.51 mm. A probe diameter of 0.51 mm gives a probe with a radius which is significantly smaller than the typically experienced Debye length. This means that sheath effects around the probe can be ignored in most circumstances.

The dimensions may be scaled, for example, depending on the size of the spacecraft. For example, in a CubeSat the centre conductor 18 may have a diameter of 0.29 mm.

In operation the probes 16 are each biased at different voltages ranging between typically +2.5 V and +10 V. Two probes 16 are mounted on one boom 26 on the aft deck of the payload. The other two probes 16 are mounted on another boom 28, mounted 180 degrees from the boom 26 with the other probes. The probes can be used simultaneously to measure the absolute electron density and the platform potential.

When the m-NLP is in a plasma and the voltages are applied to each probe, the collected current of each probe is measured.

A value for electron temperature in which the measurements are taken is estimated using a model. This value may be assigned before the measurements are taken.

Using the bias of one of the probes ($V_{b1}$) and the measured collected current of that probe ($I_1$), the bias of another of the probes ($V_{b2}$) and the measured collected current of that probe ($I_2$) and the estimated value for electron temperature, the platform potential is calculated using the following equation:

$$R = \left(\frac{I_2}{I_1}\right)^2 = \frac{V_e + V_{b2} - V_f}{V_e + V_{b1} - V_f}$$

where $V_e$ is Boltzmann's constant times the electron temperature divided by the charge of an electron, $V_f$ is the platform potential and which when it is rearranged gives:

$$V_f = \frac{(RV_{b1}) - V_{b2}}{R - 1} + V_e$$

The calculated value of platform potential is determined in orbit and in real time by a processor on board the payload 10. This calculated value of the platform potential is used to control an electron emitter (not shown) which controls the platform potential on the basis of the calculated platform potential.

It should be apparent that the foregoing relates only to the preferred embodiments of the present application and the resultant patent. Numerous changes and modification may be made herein by one of ordinary skill in the art without departing from the general spirit and scope of the invention as defined by the following claims and the equivalents thereof.

We claim:

1. A method of determining a platform potential, the method comprising:
   receiving data on a first bias voltage and a resulting first collected current of a first needle of a multi-needle Langmuir probe;
   receiving data on a second bias voltage and a resulting second collected current of a second needle of the multi-needle Langmuir probe;
   assigning a value for an electron temperature in which the multi-needle Langmuir probe was operating; and
   using the resulting first collected current data, the resulting second collected current data, the first bias voltage data, the second bias voltage data, and the value for the electron temperature to calculate the platform potential of the multi-needle Langmuir probe.

2. A method as claimed in claim 1, wherein the step of using the data to calculate the platform potential is performed in-orbit.

3. A method as claimed in claim 1, wherein the step of using the data to calculate the platform potential is performed in real-time.

4. A method as claimed in claim 2, comprising controlling the platform potential based on the calculated platform potential.

5. A method as claimed in claim 1, wherein the data is received from the multi-needle Langmuir probe with cylindrical probes and the platform potential is calculated using the following equation $$\left(\frac{I_2}{I_1}\right)^2 = \frac{V_e + V_{b2} - V_f}{V_e + V_{b1} - V_f}$$

wherein $I_2$ is the second collected current, $I_1$ is the first collected current, $V_{b2}$ is the second bias voltage, $V_{b1}$ is the first bias voltage, $V_e$ is Boltzmann's constant times the electron temperature divided by the charge of an electron, and $V_f$ is the platform potential.

6. A non-transitory computer readable medium carrying computer-executable instructions which when executed by a processor cause the processor to be arranged to carry out the method of claim 1.

7. A device for determining a platform potential, the device comprising:
   a multi-needle Langmuir Probe; and
   a processor,
   wherein the processor is arranged to receive data on a first bias voltage and a resulting first collected current of a first needle of the multi-needle Langmuir probe; receive data on a second bias voltage and a resulting second collected current of a second needle of the multi-needle Langmuir probe; assign a value for an electron temperature in which the multi-needle Langmuir probe is operating; and use the resulting first collected current data, the resulting second collected current data, the first bias voltage data, the second bias voltage data, and the value for the electron temperature to calculate the platform potential of the multi-needle Langmuir probe.

8. A device as claimed in claim 7, wherein the processor is arranged to be able to calculate the platform potential when in orbit.

9. A device as claimed in claim 7, wherein the processor is arranged to calculate the platform potential when in real-time.

10. A device as claimed in claim 8, wherein the device comprises a controller that is arranged to control the platform potential based on the in orbit and/or real-time calculations.

11. A device as claimed in claim 10, wherein the device comprises an electron emitter which is arranged to be able to control the platform potential on the basis of the calculated platform potential.

12. A device as claimed in claim 7, wherein the multi-needle Langmuir probe has cylindrical probes.

13. A device as claimed in claim 12, wherein the processor is arranged to calculate the platform potential using the following equation $$\left(\frac{I_2}{I_1}\right)^2 = \frac{V_e + V_{b2} - V_f}{V_e + V_{b1} - V_f}$$

wherein $I_2$ is the second collected current, $I_1$ is the first collected current, $V_{b2}$ is the second bias voltage, $V_{b1}$ is the first bias voltage, $V_e$ is Boltzmann's constant times the electron temperature divided by the charge of an electron, and $V_f$ is the platform potential.

14. A device as claimed in claim 7, wherein the multi-needle Langmuir probe has more than two probes.

* * * * *